(12) United States Patent
Hori et al.

(10) Patent No.: US 7,361,613 B2
(45) Date of Patent: Apr. 22, 2008

(54) SEMICONDUCTOR DEVICE, MANUFACTURE AND EVALUATION METHODS FOR SEMICONDUCTOR DEVICE, AND PROCESS CONDITION EVALUATION METHOD

(75) Inventors: Mitsuaki Hori, Kawasaki (JP); Naoyoshi Tamura, Kawasaki (JP); Mayumi Shigeno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/480,960

(22) Filed: Jul. 6, 2006

(65) Prior Publication Data
US 2006/0252280 A1 Nov. 9, 2006

Related U.S. Application Data

(62) Division of application No. 10/662,384, filed on Sep. 16, 2003, now Pat. No. 7,098,153.

(30) Foreign Application Priority Data
Sep. 17, 2002 (JP) .............................. 2002-270251

(51) Int. Cl.
*H01L 21/31* (2006.01)
(52) U.S. Cl. ...................... 438/786; 438/769; 257/368; 257/E21.268; 257/E21.193; 257/E21.269; 257/E21.584; 257/E21.285; 257/E21.293; 257/E21.576
(58) Field of Classification Search ........ 438/786–787, 438/769, 275; 257/296, 368
See application file for complete search history.

(56) References Cited

U.S. PATENT DOCUMENTS 5,674,788 A * 10/1997 Wristers et al. ............. 438/301

| | | | |
|---|---|---|---|
| 6,215,146 B1 | 4/2001 | Umeda et al. | |
| 6,252,296 B1 | 6/2001 | Umeda et al. | |
| 6,524,968 B2 | 2/2003 | Takahashi et al. | |
| 6,740,605 B1 | 5/2004 | Shiraiwa et al. | |

(Continued)

FOREIGN PATENT DOCUMENTS

JP        05-102482 A        4/1993

(Continued)

OTHER PUBLICATIONS

Chen et al., "Downscaling Limit of Equivalent Oxide Thickness in Formation of Ultrathin Gate Dielectric by Thermal-Enhanced Remote Plasma Nitridation", IEEE Transactions on Electron Devices, May 2002, vol. 49, No. 5. p. 840-845.

(Continued)

*Primary Examiner*—A. Sefer
(74) *Attorney, Agent, or Firm*—Westerman, Hattori, Daniels & Adrian, LLP.

(57) ABSTRACT

A gate insulating film made of silicon oxynitride is disposed on the partial surface area of a semiconductor substrate. A gate electrode is disposed on the gate insulating film. Source and drain regions are disposed on both sides of the gate electrode. An existence ratio of subject nitrogen atoms to a total number of nitrogen atoms in the gate insulating film is 20% or smaller, wherein three bonds of each subject nitrogen atom are all coupled to silicon atoms and remaining three bonds of each of three silicon atoms connected to the subject nitrogen atom are all coupled to other nitrogen atoms.

4 Claims, 9 Drawing Sheets

U.S. PATENT DOCUMENTS

| | | |
|---|---|---|
| 6,890,869 B2 | 5/2005 | Chung |
| 2002/0055273 A1 | 5/2002 | Hasegawa |
| 2002/0072177 A1 | 6/2002 | Grider |
| 2003/0001218 A1 | 1/2003 | Takagi |
| 2003/0168706 A1 | 9/2003 | Aoki et al. |
| 2005/0285180 A1* | 12/2005 | Mitani et al. ............. 257/315 |
| 2007/0018231 A1* | 1/2007 | Mitani et al. ............. 257/315 |

FOREIGN PATENT DOCUMENTS

| | | | |
|---|---|---|---|
| JP | 06-151829 A | | 5/1994 |
| JP | 11-204787 | | 7/1999 |
| JP | 11-204787 A | | 7/1999 |
| JP | 2000-332014 | * | 11/2000 |
| JP | 2001-053073 A | | 2/2001 |
| JP | 2001-111046 | * | 4/2001 |
| JP | 2001-111046 A | | 4/2001 |
| JP | 2001-203198 A | | 7/2001 |

OTHER PUBLICATIONS

Office Action dated Jan. 23, 2007, issued in corresponding Japanese Application No. 2002-270251.

* cited by examiner

SEMICONDUCTOR DEVICE, MANUFACTURE AND EVALUATION METHODS FOR SEMICONDUCTOR DEVICE, AND PROCESS CONDITION EVALUATION METHOD

This application is a divisional of application Ser. No. 10/662,384, filed on Sep. 16, 2003, now U.S. Pat. No. 7,098,153.

CROSS REFERENCE TO RELATED APPLICATION

This application is based on and claims priority of Japanese Patent Application No. 2002-270251 filed on Sep. 17, 2002, the entire contents of which are incorporated herein by reference.

BACKGROUND OF THE INVENTION

A) Field of the Invention

The present invention relates to semiconductor devices using a silicon oxynitride film as a gate insulating film, to manufacture and evaluation methods for such semiconductor devices, and to a process condition evaluation method of evaluating the conditions of a silicon oxynitride film forming process.

B) Description of the Related Art

A gate insulating film of a complementary MOS field effect transistor (CMOSFET) becomes thinner as the semiconductor integrated circuit device is made smaller and highly integrated. As a gate insulating film is made too thin, boron atoms implanted into the gate electrode of a p-channel MOSFET may pass through the gate insulating film and diffuse into the channel region. This boron diffusion (boron drainage) can be prevented by using, as the material of a gate insulating film, silicon oxynitride made by introducing nitrogen into silicon oxide. In introducing nitrogen atoms into silicon oxide, annealing is generally performed in a gas atmosphere of ammonium ($NH_3$), NO or $N_2O$ by using a heat treatment system of a resistance heating type or a lamp heating type.

A method using nitrogen plasma has been proposed recently to introduce more nitrogen atoms. The effects of preventing boron drainage can be enhanced by raising the nitrogen density in a gate insulating film. As the nitrogen density is raised, the dielectric constant of the gate insulating film becomes higher than that of a silicon oxide film. The same electrostatic capacitance can therefore be retained by thickening the gate insulating film. This results in a small gate leak current.

As nitrogen is introduced by using a heat treatment system of a resistance heating type or a lamp heating type, the nitrogen density distribution has a peak near at the interface between a silicon oxynitride film and a silicon substrate. As nitrogen is introduced by using nitrogen plasma, the nitrogen density distribution has a peak in the central area in the depth direction of a silicon oxynitride film or in an area nearer to the surface of the film than the central area. By using nitrogen plasma, the electrical characteristics (carrier mobility and the like) and reliability of a metal insulator semiconductor FET (MISFET) can be improved because the nitrogen density in the gate insulating film can be raised without raising the nitrogen density near at the interface between the gate insulating film and the channel.

It is known that the mutual conductance (Gm) of MISFET, which is one index indicative of a MISFET performance, is degraded depending upon a method of introducing nitrogen. Refer to the related technical paper: "Downscaling Limit of Equivalent Oxide Thickness in Formation of Ultrathin Gate Dielectric by Thermal-Enhanced Remote Plasma Nitridation" by Chien-Hao Chen, IEEE TRANSACTIONS ON ELECTRON DEVICES, MAY 2002, VOL. 49, NO. 5. p. 840-845.

Japanese Patent Laid-open Publication No. HEI-11-204787 discloses the preferable structure of a gate insulating film which can realize high speed and high reliability MISFET. This gate insulating film is made of silicon oxynitride, and nitrogen atoms distribute only near at the interface between the silicon substrate and gate insulating film. Near at the interface, each of all nitrogen atoms is coupled to two silicon atoms and one oxygen atom or to three silicon atoms.

A plasma nitridation process is difficult to form the gate insulating film disclosed in this Publication. This is because the plasma nitridation process introduces nitrogen into the gate insulating film in an area away from the interface between the silicon substrate and gate insulating film or in an area near at the surface of the gate insulating film. It is also difficult to distribute nitrogen atoms only near at the interface between a gate insulating film and a silicon substrate if the gate insulating film becomes thinner.

There are a variety of gate insulating film forming methods. For the earlier entry of better performance semiconductor devices into markets, it is required to clarify the relation between the nitridation state of a gate insulating film and a MISFET performance index such as a mutual conductance (Gm). If the relation therebetween is clarified, analyzing a silicon oxynitride film used as a gate insulating film of MISFET makes it possible to estimate the performance of MISFET.

SUMMARY OF THE INVENTION

An object of this invention is to provide a semiconductor device which uses silicon oxynitride as the material of a gate insulating film and is excellent in the electrical characteristics, and a manufacture method for such a semiconductor device.

Another object of the invention is to provide a method of evaluating the electrical characteristics of a semiconductor device which uses silicon oxynitride as the material of a gate insulating film.

Another object of the invention is to provide a method of judging whether a process is satisfactory or not which process forms a silicon oxynitride film to be used as a gate insulating film.

According to one aspect of the present invention, there is provided a semiconductor device comprising: a semiconductor substrate; a gate insulating film made of silicon oxynitride and disposed on a partial surface area of the semiconductor substrate; a gate electrode disposed on the gate insulating film; and source and drain regions disposed on both sides of the gate electrode, wherein an existence ratio of subject nitrogen atoms to a total number of nitrogen atoms in the gate insulating film is 20% or smaller and wherein three bonds of each subject nitrogen atom are all coupled to silicon atoms and remaining three bonds of each of three silicon atoms connected to the subject nitrogen atom are all coupled to other nitrogen atoms.

According to another aspect of the present invention, there is provided a method of manufacturing a semiconductor device, comprising steps of: forming a silicon oxynitride film on a surface of a semiconductor substrate; forming a conductive film for a gate electrode on the silicon oxynitride film; patterning the conductive film to leave a gate electrode; and implanting impurities into semiconductor regions on both sides of the gate electrode to form source and drain regions, wherein in the step of forming the silicon oxynitride film, the silicon oxynitride film is formed under the conditions that an existence ratio of subject nitrogen atoms to a total number of nitrogen atoms in the silicon oxynitride film becomes 20% or smaller and wherein three bonds of each subject nitrogen atom are all coupled to silicon atoms and remaining three bonds of each of three silicon atoms connected to the subject nitrogen atom are all coupled to other nitrogen atoms.

At the existence ratio of 20% or smaller, the electrical characteristics of a semiconductor device can be maintained good.

According to another aspect of the present invention, there is provided a method of evaluating the characteristics of a semiconductor device, comprising steps of: forming a silicon oxynitride film on a surface of a semiconductor substrate; measuring an existence ratio of subject nitrogen atoms to a total number of nitrogen atoms in the silicon oxynitride film, wherein three bonds of each subject nitrogen atom are all coupled to silicon atoms and remaining three bonds of each of three silicon atoms connected to the subject nitrogen atom are all coupled to other nitrogen atoms; and evaluating characteristics of a MISFET using the silicon oxynitride film as a gate insulating film, in accordance with the measured existence ratio.

The electrical characteristics of a MISFET can be estimated from the existence ratio without manufacturing an actual MISFET.

According to another aspect of the present invention, there is provided a method of evaluating the characteristics of a semiconductor device, comprising steps of: forming a silicon oxynitride film on a surface of a semiconductor substrate; measuring an energy spectrum of electrons on 1s orbital of nitrogen atoms in the silicon oxynitride film by using X-ray photoelectron spectroscopy; separating a peak obtained by X-ray photoelectron spectroscopy into at least two first peaks on a higher energy side than an energy of electrons on 1s orbital of nitrogen atoms in silicon nitride and one second peak on a lower energy side than at least two peaks; calculating a ratio of an area of the second peak to a total area of at least two first peaks and the second peak; and evaluating characteristics of a MISFET using the silicon oxynitride film as a gate insulating film, in accordance with the calculated ratio.

The electrical characteristics of a MISFET can be estimated from the area ratio without manufacturing an actual MISFET.

The process conditions of a silicon oxynitride film can be judged whether the conditions were good or bad, by analyzing the silicon oxynitride film by the above-described method.

According to another aspect of the present invention, there is provided a semiconductor device comprising: a semiconductor substrate; a gate insulating film made of a lamination of a silicon oxynitride film and a high dielectric constant film disposed in an order recited on a partial surface area of the semiconductor substrate, the high dielectric constant film having a dielectric constant higher than a dielectric constant of the silicon oxynitride film; a gate electrode disposed on the gate insulating film; and source and drain regions disposed on both sides of the gate electrode, wherein an energy spectrum of electrons on 1s orbital of nitrogen atoms in the gate insulating film is measured by using X-ray photoelectron spectroscopy; and a peak obtained by X-ray photoelectron spectroscopy is separated into at least two first peaks on a higher energy side than an energy of electrons on 1s orbital of nitrogen atoms in silicon nitride and one second peak on a lower energy side than at least two first peaks, wherein a ratio of an area of the second peak to a total area of at least two first peaks and the second peak is 20% or smaller.

At the area ratio of 20% or smaller, the electrical characteristics of a semiconductor device can be maintained good.

As above, the electrical characteristics of a MISFET can be estimated by analyzing a gate insulating film made of silicon oxynitride. It is possible to judge adequacy of the process conditions of a silicon oxynitride film forming process.

DESCRIPTION OF THE PREFERRED EMBODIMENTS

Silicon oxynitride films were formed on silicon substrates by different methods to prepare six samples A to F of MISFETs. These samples were used for checking the relationship between the composition of silicon oxynitride and the performance of MISFETs having a gate insulating film made of silicon oxynitride. For the samples A to E, the surface of each silicon substrate was oxidized in an oxygen atmosphere at 900° C. to form a silicon oxide film having a thickness of 0.85 nm. For the sample F, the surface of a silicon substrate was oxidized in an oxidizing atmosphere containing $N_2O$ gas to obtain a silicon oxide film having a thickness of 0.85 nm.

For the sample A, by using a remote plasma processing system, the silicon oxide film was exposed in nitrogen plasma for 60 seconds to introduce nitrogen atoms into the silicon oxide film and form a silicon oxynitride film.

For the samples B to F, heat treatment was performed in NO gas to introduce nitrogen atoms into each silicon oxide film and form a silicon oxynitride film. For the sample B, the gas pressure during heat treatment was set to 665 Pa and the heat treatment time was set to 30 seconds. For the sample C, the gas pressure during heat treatment was set to 665 Pa and the heat treatment time was set to 15 seconds. For the sample D, the gas pressure during heat treatment was set to 2660 Pa (20 Torr) and the heat treatment time was set to 15 seconds. For the sample E, the gas pressure during heat treatment was set to 665 Pa and the heat treatment time was set to 5 seconds. For the sample F, the gas pressure during heat treatment was set to 665 Pa and the heat treatment time was set to 15 seconds. The thickness of each sample silicon oxynitride film was about 1.0 to 1.2 nm.

Figure 1:
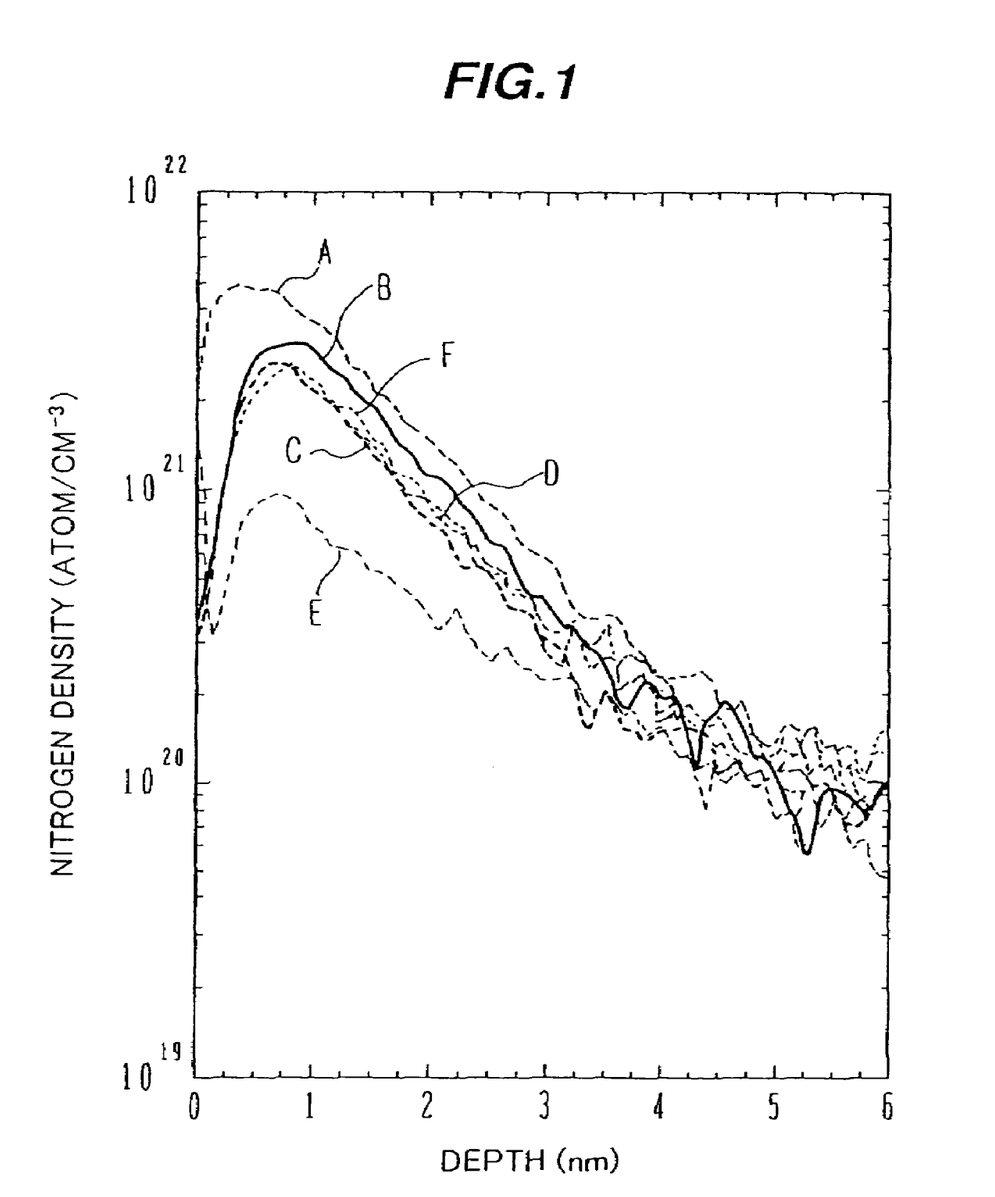
FIG. 1 is a graph showing the nitrogen densities of sample gate insulating films in the depth direction.

FIG. 1 shows the nitrogen density distribution in the silicon oxynitride film and silicon substrate of each sample in the depth direction. The abscissa represents a depth from the surface of each silicon oxynitride film in the unit of "nm" and the ordinate represents a nitrogen density in the unit of "atom/cm$^3$". Secondary ion mass spectroscopy (SIMS) was used for measuring a nitrogen density.

The nitrogen densities of the samples B to F take maximum values at the positions slightly deeper than the centers of the silicon oxynitride films in the depth direction. In contrast, the nitrogen density of the sample A takes the maximum value at the position shallower than the center of the silicon nitride film in the depth direction. As seen from these results, plasma nitridation can introduce a number of nitrogen atoms in the area near the surface of the film.

Figure 2:
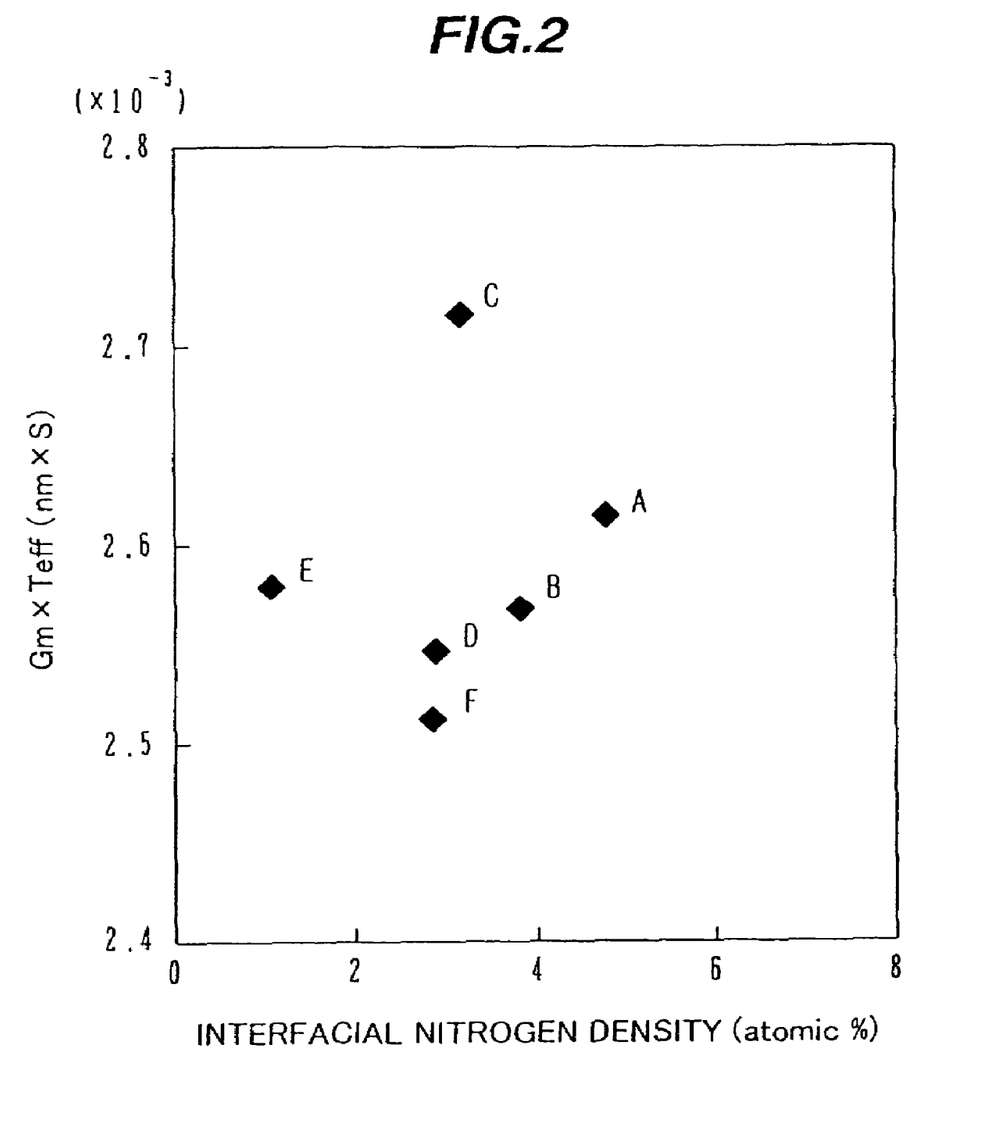
FIG. 2 is a graph showing the relation between Gm×Teff and the nitrogen density at the interfaces between sample gate insulating films and silicon substrates.

FIG. 2 is a graph showing the relation between the electrical characteristics and the nitrogen density at the interfaces between sample silicon oxynitride films and silicon substrates. The abscissa represents a nitrogen density at an interface in the unit of "atomic %", and the ordinate represents a product of a mutual conductance (Gm) and a film thickness (Teff) as converted using inversion capacitance, in the unit of "nm×S". The film thickness as converted using inversion capacitance is the film thickness of a gate insulating film as calculated from the dielectric constant of silicon oxide and the capacitance between the substrate and gate electrode measured in the state that the conductivity type of the substrate is inverted. Namely, the converted film thickness of the gate insulating film is calculated on the assumption that the gate insulating film is made of silicon oxide.

It can be seen from FIG. 2 that the electrical characteristics of MISFET have almost no correlation to the nitrogen density at the interface between the silicon oxynitride film and silicon substrate.

The bonding state of nitrogen atoms in a silicon oxynitride film was investigated with X-ray photoelectron spectroscopy (XPS). Mg-ká line was used as the excitation source of X-ray to measure, at a pickup angle of 90°, an energy spectrum of photoelectrons emitted from 1s orbital.

Figure 3:
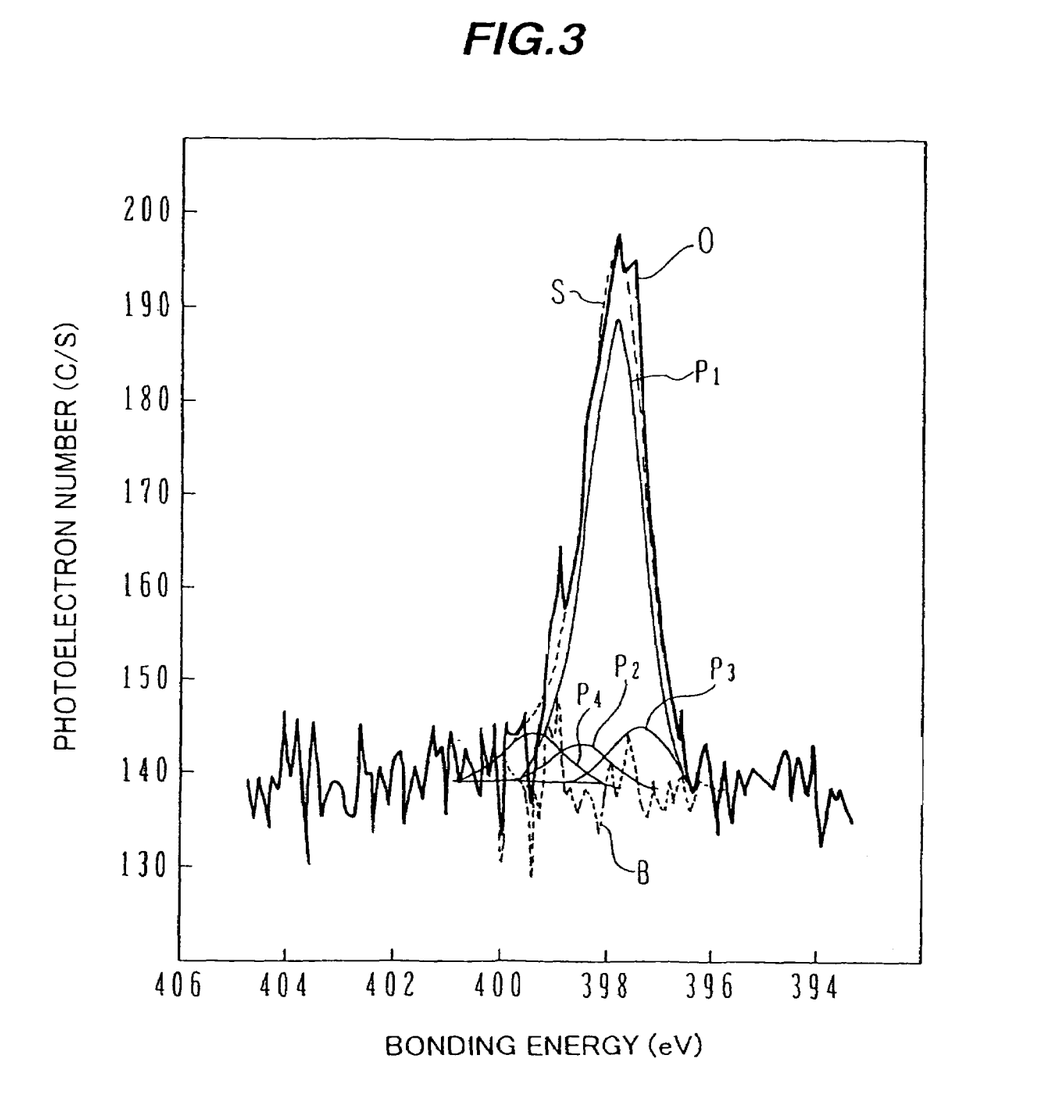
FIG. 3 is a graph showing the energy spectrum of electrons on the 1s orbital of nitrogen atoms in one sample gate insulating film and also showing the results of separation of a detected peak into a plurality of peaks.

FIG. 3 shows the measurement results (XPS spectrum) of one sample. The abscissa represents a bonding energy in the unit of "eV" and the ordinate represents the number of detected photoelectrons in the unit of "count/s"). A bold line O in FIG. 3 indicates a peak (N 1s peak) of the energy spectrum of photoelectrons emitted from the 1s orbital of nitrogen atoms. Asymmetrical N 1s peaks were observed when a plurality of samples were measured. It can be understood from this that the N 1s peak can be separated at least into two peaks.

Figure 4A:
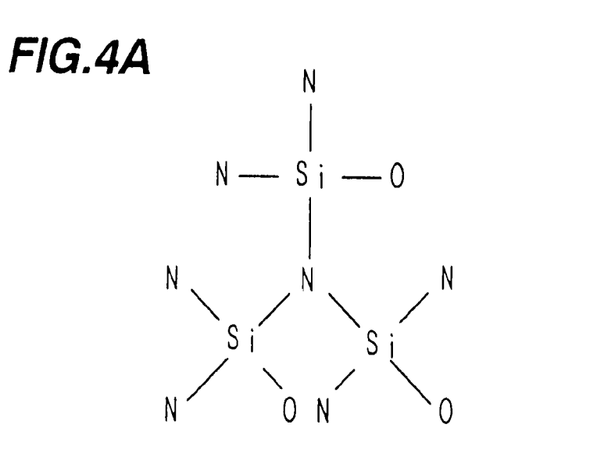
FIG. 4A to 4D are chemical structure diagrams showing examples of the coupling state of nitrogen atoms in a gate insulating film.
Figure 4B:
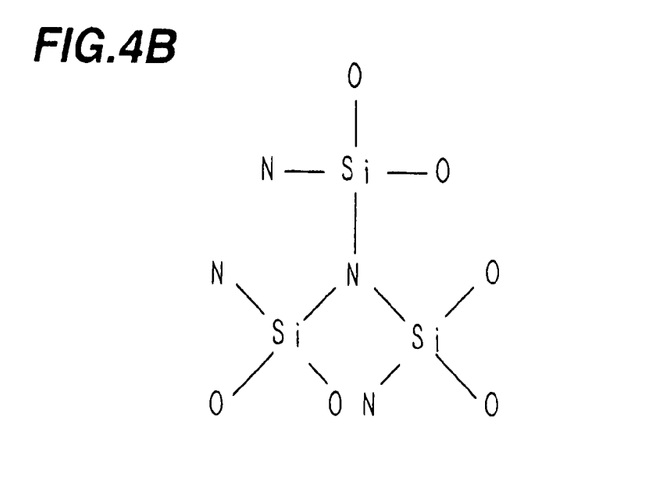
Figure 4C:
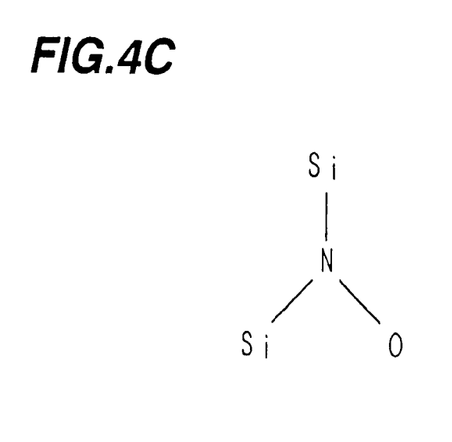

It has been found from the measurement results of a plurality of samples that the N 1s peak O can be separated into two representative peaks $P_1$ and $P_2$. The chemical structures corresponding to the two peaks $P_1$ and $P_2$ have not been elucidated as yet. It is conceivable, however, that these peaks $P_1$ and $P_2$ correspond to oxynitride because the peaks appear at positions having the bonding energies larger than that of an electron on the 1s orbital of a nitrogen atom in silicon nitride ($Si_3N_4$). For example, with a central focus on a nitrogen atom, it can be assumed that these peaks correspond to the following structures: as shown in FIG. 4A (or 4B) the structure that three bonds of a nitrogen atom are coupled to silicon atoms and each silicon atom is coupled to an oxygen atom (or two oxygen atoms) and two nitrogen atoms (or one nitrogen atom), or as shown in FIG. 4C the structure that two of the three bonds of a nitrogen atom are coupled to two silicon atoms and the remaining one is coupled to an oxygen atom.

Some samples showed a peak having an energy of the peak N 1s subtracted by energies of the separated peaks $P_1$ and $P_2$, at the position having the energy smaller than those of the peaks $P_1$ and $P_2$. In order to separate such a peak N 1s, it is necessary to set another peak $P_3$ on the lower energy side, in addition to the peaks $P_1$ and $P_2$.

Figure 4D:
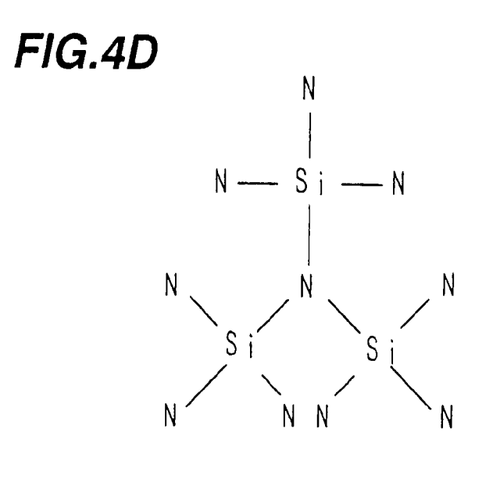

The energy of the newly set peak $P_3$ at the center position is approximate to the bonding energy of silicon nitride. As shown in FIG. 4D, it can be considered that this peak $P_3$ corresponds to the structure that all of three bonds of a nitrogen atom are coupled to three silicon atoms and all of the remaining three bonds of each silicon atom are coupled to three nitrogen atoms. In this specification, this structure is described as a "$NSi_3$ structure (bonds of Si are all coupled to N)".

It is also necessary to set a peak $P_4$ at the position having an energy higher than those of $P_1$ and $P_2$, because there is a difference, also on the high energy side, between the energy of the peak N 1s and the total energy of peaks $P_1$ and $P_2$.

A broken line S shown in FIG. 3 indicates a sum of four separated peaks $P_1$ to $P_4$. This line has good alignment with the measurement results indicated by the bold line O. A broken line B indicates the peak on the bold line O subtracted by the peak on the broken line S.

Figure 5:
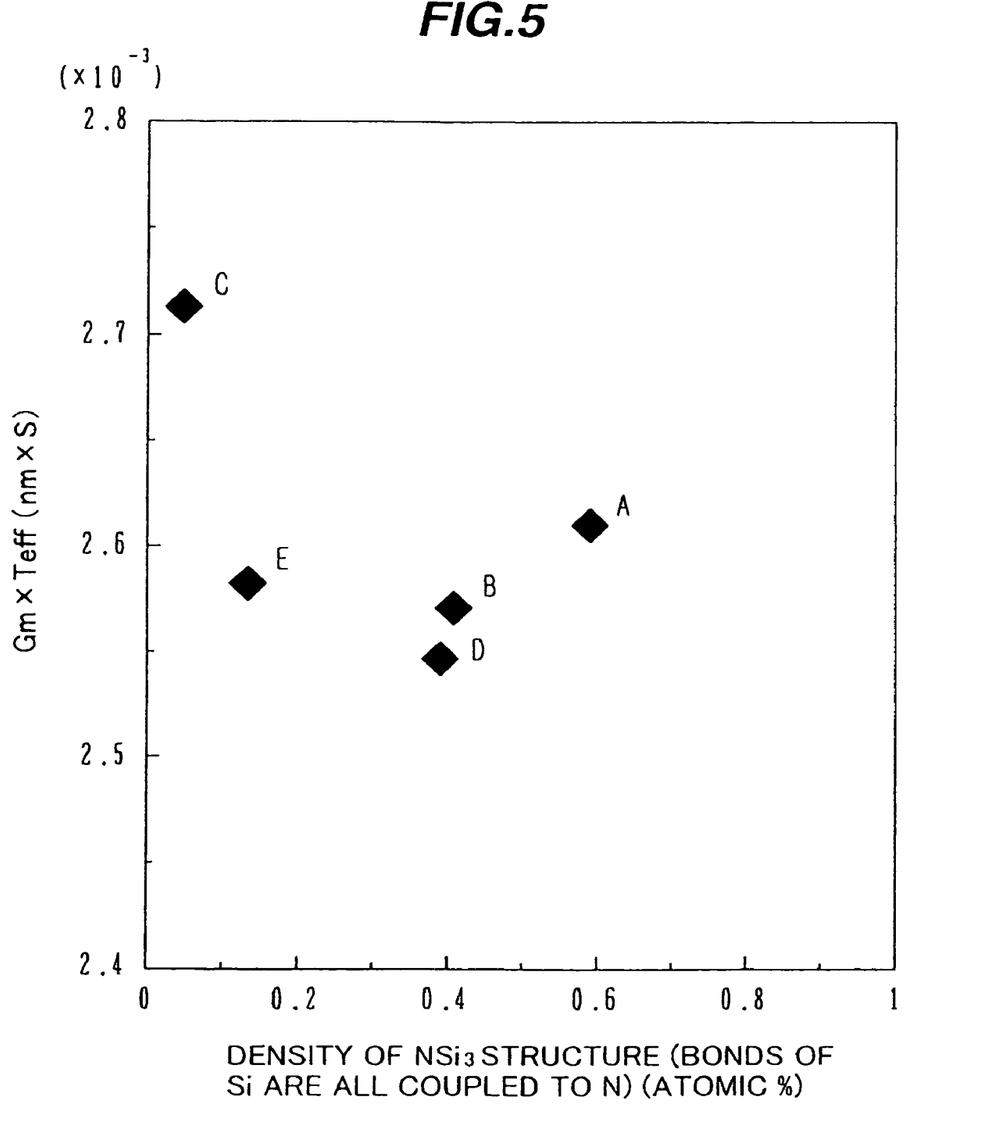
FIG. 5 is a graph showing the relation between Gm×Teff and the density of an $NSi_3$ structure (bonds of Si are all coupled to N) in sample gate insulating films.

FIG. 5 shows the relation between a density of the $NSi_3$ structure (bonds of Si are all coupled to N)" and the electrical characteristics. The abscissa represents a density of the $NSi_3$ structure (bonds of Si are all coupled to N) in the unit of "atomic %", and the ordinate represents a product of a mutual conductance (Gm) and a film thickness (Teff) as converted using inversion capacitance, in the unit of "nm×S".

The density of the $NSi_3$ structure (bonds of Si are all coupled to N) was obtained using the following method. First, three peaks of a silicon oxynitride film were measured with XPS, including an Si 2p peak, an N 1s peak and an O 1s peak. A ratio of Si, N and O atomic densities was calculated from the area ratio of three peaks.

As seen from FIG. 5, the electrical characteristics have almost no correlation to the density of the $NSi_3$ structure (bonds of Si are all coupled to N).

Figure 6:
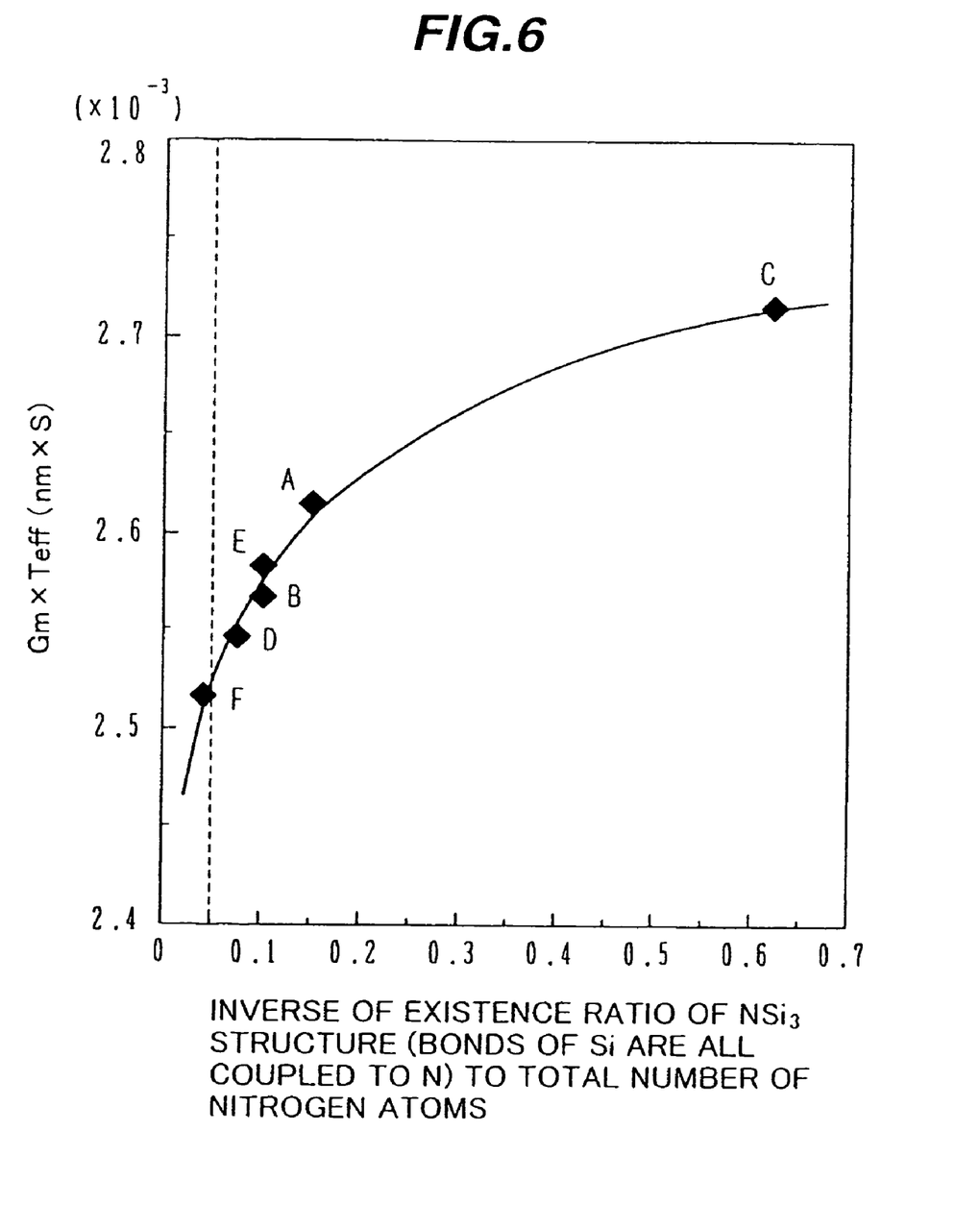
FIG. 6 is a graph showing the relation between the electrical characteristics and an existence ratio of the $NSi_3$ structure (bonds of Si are all coupled to N) to the total number of nitrogen atoms in sample gate insulating films.

FIG. 6 is a graph showing the relation between the electrical characteristics and an existence ratio of the $NSi_3$ structure (bonds of Si are all coupled to N) to the total number of nitrogen atoms. The abscissa represents an inverse of the existence ratio of the $NSi_3$ structure (bonds of Si are all coupled to N) to the total number of nitrogen atoms in the unit of "1/%", and the ordinate represents a product of a mutual conductance (Gm) and a film thickness (Teff) as converted using inversion capacitance, in the unit of "nm×S"). The existence ratio of the $NSi_3$ structure (bonds of Si are all coupled to N) to the total number of nitrogen atoms is obtained by dividing the area of the peak $P_3$ shown in FIG. 3 by the area of the peak S which is the total area of the four separated peaks $P_1$ to $P_4$.

As the inverse of the existence ratio of the $NSi_3$ structure (bonds of Si are all coupled to N) to the total number of nitrogen atoms becomes small, GmxTeff becomes gradually small. As the inverse of the existence ratio of the $NSi_3$ structure (bonds of Si are all coupled to N) to the total number of nitrogen atoms becomes lower than about 0.05, GmxTeff becomes abruptly small. In order to obtain a large mutual conductance, it is preferable that the inverse of the existence ratio of the $NSi_3$ structure (bonds of Si are all coupled to N) to the total number of nitrogen atoms is set to 0.05 or larger. Namely, it is preferable that the existence ratio of the $NSi_3$ structure (bonds of Si are all coupled to N) to the total number of nitrogen atoms is set to 20% or smaller.

As the thickness of a gate insulating film becomes thin, it becomes difficult to manufacture the structure disclosed in Japanese Patent Laid-open Publication No. HEI-11-204787, i.e., the structure that nitrogen atoms are introduced only near at the interface between the gate insulating film and semiconductor substrate. Also in such a case, the electrical characteristics of MISFET can be estimated by analyzing the silicon oxynitride film with the method of this embodiment. The evaluation method of the embodiment is particularly effective if the thickness of a gate insulating film is 3 nm or thinner.

In this embodiment described above, the surface of a silicon substrate is oxidized to form a silicon oxide film and thereafter the silicon oxide film is nitrided to form a silicon oxynitride film. These processes may be reversed. Namely, the surface of a silicon substrate is nitrided to form a silicon nitride film and thereafter the silicon nitride film is oxidized to form a silicon oxynitride film. Also in this case, the embodiment is expected to be effective for analyzing the silicon oxynitride film.

Figure 7:
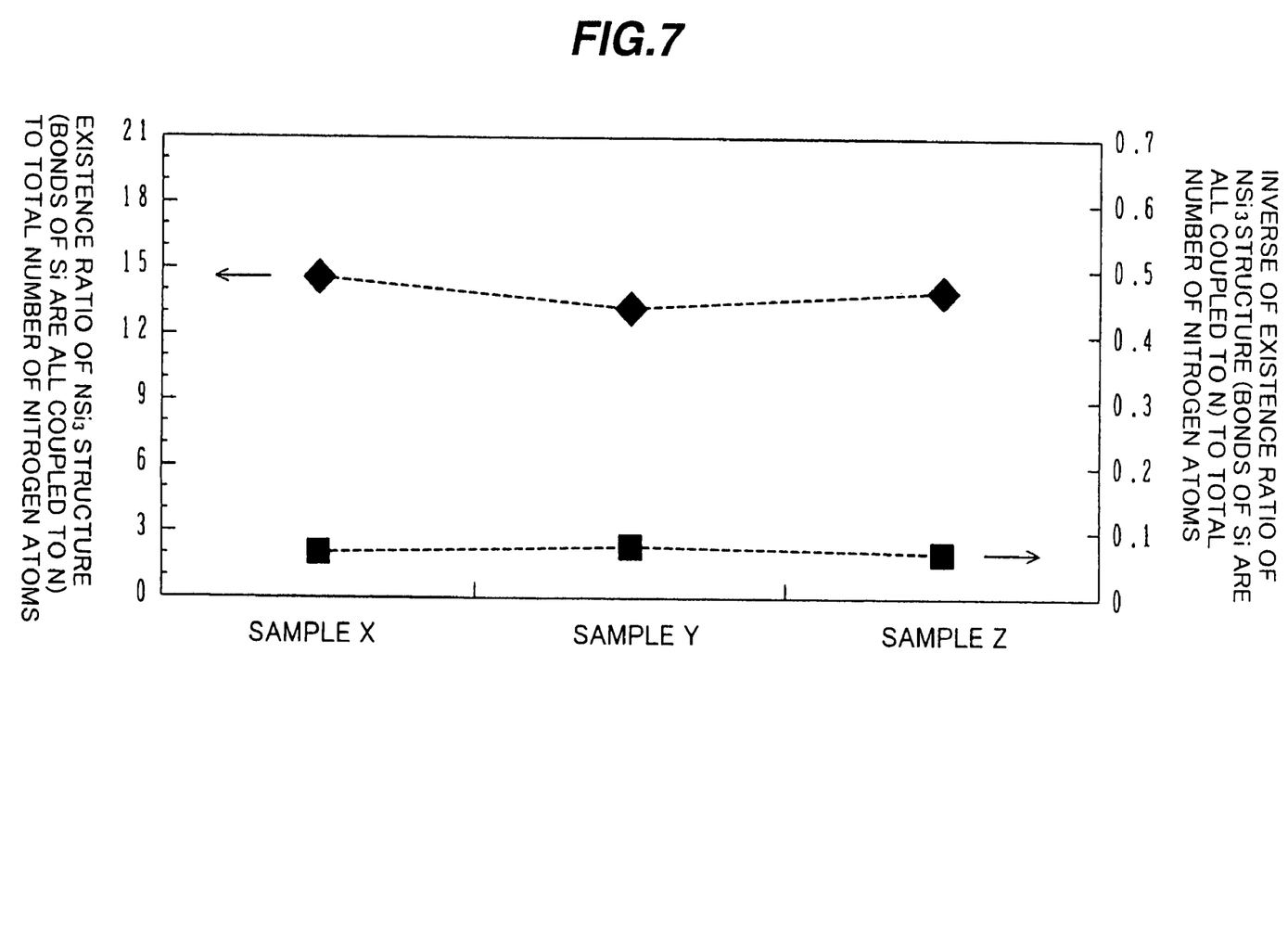
FIG. 7 is a graph showing an existence ratio and its inverse of the $NSi_3$ structure (bonds of Si are all coupled to N) to the total number of nitrogen atoms in samples manufactured under the same process conditions.

FIG. 7 is a graph showing an existence ratio and its inverse of the $NSi_3$ structure (bonds of Si are all coupled to N) to the total number of nitrogen atoms in three samples X, Y and Z. The samples X, Y and Z were manufactured at different times under the same process conditions including a process temperature, a process time, a gas flow rate and a pressure. The existence ratio of the $NSi_3$ structure (bonds of Si are all coupled to N) to the total number of nitrogen atoms has only a small variation and is stable. By measuring the existence ratio of the $NSi_3$ structure (bonds of Si are all coupled to N) to the total number of nitrogen atoms in a silicon oxynitride film, it is possible to judge whether the process conditions for a silicon oxynitride film are proper or not.

Neither the quality of semiconductor devices can be guaranteed sufficiently nor the stability of manufacture systems can be managed sufficiently, if a film thickness is optically measured with an ellipsometer, if an N density is measured in a simple manner with SIMS or XPS, if a capacitance is electrically measured with a corona charger, or if Hg electrodes or the like, or fixed charges are measured.

Next, description will be given on a manufacture method for a semiconductor device of the embodiment with reference to FIGS. 8A to 8D. Different power supply voltages are sometimes used between an input/output circuit and an internal circuit of a semiconductor integrated circuit device. In order to obtain the good reliability of the input/output circuit, it is preferable to properly change the thicknesses of gate insulating films in accordance with gate voltages to be applied. Also in the internal circuit, the thicknesses of gate insulating films are properly set in some cases in accordance with the use objects of MISFETs. For example, the gate insulating film of MISFET necessary for a high speed operation is designed thinner than that of MISFET necessary for a low power consumption. The semiconductor device shown in FIGS. 8A to 8D has two MISFETs having different gate insulating film thicknesses.

Figure 8A:
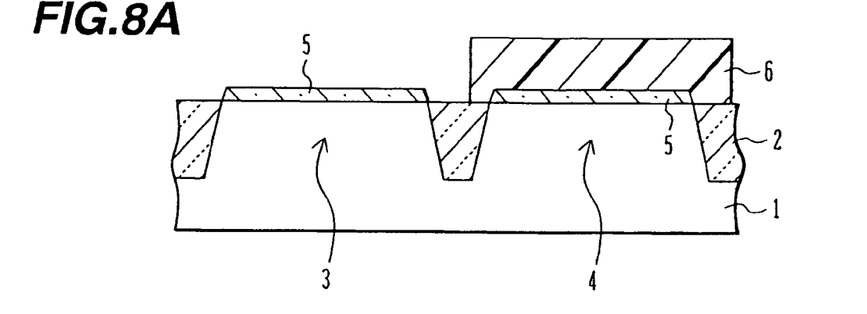
FIGS. 8A to 8D are cross sectional views illustrating a manufacture method for a semiconductor device according to an embodiment.

As shown in FIG. 8A, an element separation insulating region 2 is formed by shallow trench isolation (STI) in a surface layer of a semiconductor substrate 1 made of silicon. The element separation insulating region 2 defines active regions 3 and 4. Ions are implanted into the active regions for the adjustment of impurity concentrations.

A silicon oxide film 5 having a thickness of 7 nm is formed on the surface of the active regions 3 and 4 by vapor oxidation at 800° C. The surface of the active region 4 is covered with a resist pattern 6 and the silicon oxide film 5 formed on the surface of the active region 3 is removed by using hydrofluoric acid. The resist pattern 6 is thereafter removed.

Figure 8B:
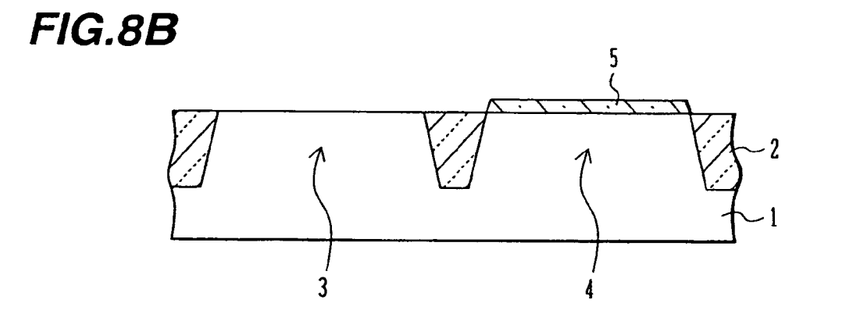

As shown in FIG. 8B, the silicon substrate 1 is therefore exposed in the active region 3 and the silicon oxide film 5 is left on the surface of the active region 4.

Figure 8C:
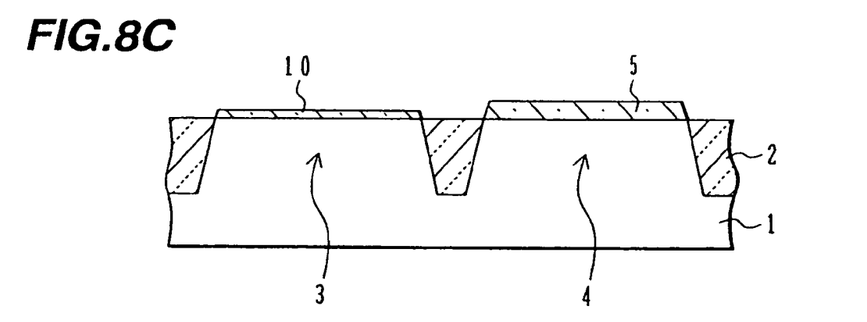

As shown in FIG. 8C, second oxidation is performed in a dry oxygen atmosphere. On the surface of the active region 3, a silicon oxide film 10 having a thickness of 1.2 nm is therefore formed which is thinner than the silicon oxide film 5. This second oxidation slightly thickens the silicon oxide film 5 on the surface of the active region 4.

By repeating similar processes, silicon oxide films having three different thicknesses may be formed.

The silicon oxide films 5 and 10 are nitrided by performing heat treatment in a nitridation atmosphere containing nitrogen plasma, NO, $N_2O$ or the like by using a down-flow plasma system. Gate insulating films 5 and 10 made of silicon oxynitride are therefore formed.

Calculation is made for the existence ratios of the $NSi_3$ structures (bonds of Si are all coupled to N) to the total number of nitrogen atoms in the gate insulating films 5 and 10. As described earlier, the N 1s peak shown in FIG. 3 is measured and separated into a plurality of peaks to obtain the existence ratio. It is possible to estimate the GmxTeff values of MISFETs from the measurement results and the graph shown in FIG. 6. If the existence ratio of the $NSi_3$ structure (bonds of Si are all coupled to N) to the total number of nitrogen atoms is 20% or smaller, good electrical characteristics can be expected. It is also possible to judge that the process conditions for forming the silicon oxynitride film were good.

If the existence ratio of the $NSi_3$ structure (bonds of Si are all coupled to N) to the total number of nitrogen atoms is larger than 20%, it is judged that the process conditions for forming the silicon oxynitride film were shifted from setting values. In such a case, manufacture systems, particularly, a nitridation system and a gas supply system, are subjected to maintenance and inspection to adjust each system and satisfy the set process conditions. The judgment criterion, based on which the process conditions are judged whether they are good or bad, may be set to a value different from 20% or larger. For example, in order to manage a variation in electrical characteristics, the judgment criterion may be set to that the existence ratio of the $NSi_3$ structure (bonds of Si are all coupled to N) to the total number of nitrogen atoms falls in range from 10% to 15%.

Figure 8D:
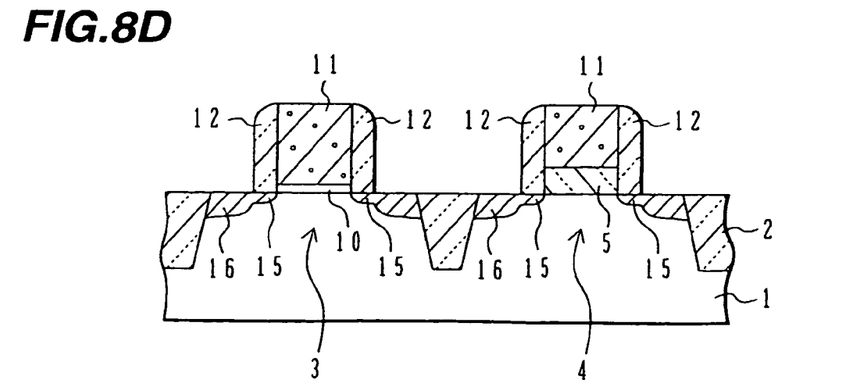

As shown in FIG. 8D, gate electrodes 11 of polysilicon are formed, ions are implanted to form extension regions 15 of sources and drains, ions are implanted (e.g., into pockets) to adjust the impurity concentration profile of the semiconductor substrate surface layer of sources and drains, side wall spacers 12 are formed, and ions are implanted to form source/drain regions 16.

According to this embodiment, after the gate insulating film is formed, the electrical characteristics of MISFET can be estimated before MISFET is formed. The process conditions for forming a silicon oxynitride film can be judged whether they were bad or good.

If an oxidation method and a nitridation method used for the manufacture of semiconductor devices are changed or if the thickness of a gate insulating film is to be changed, silicon oxynitride films are formed under various conditions and the existence ratio of the $NSi_3$ structure (bonds of Si are all coupled to N) to the total number of nitrogen atoms is calculated. In this manner, proper process conditions can be found and a development efficiency can be improved.

Figure 9:
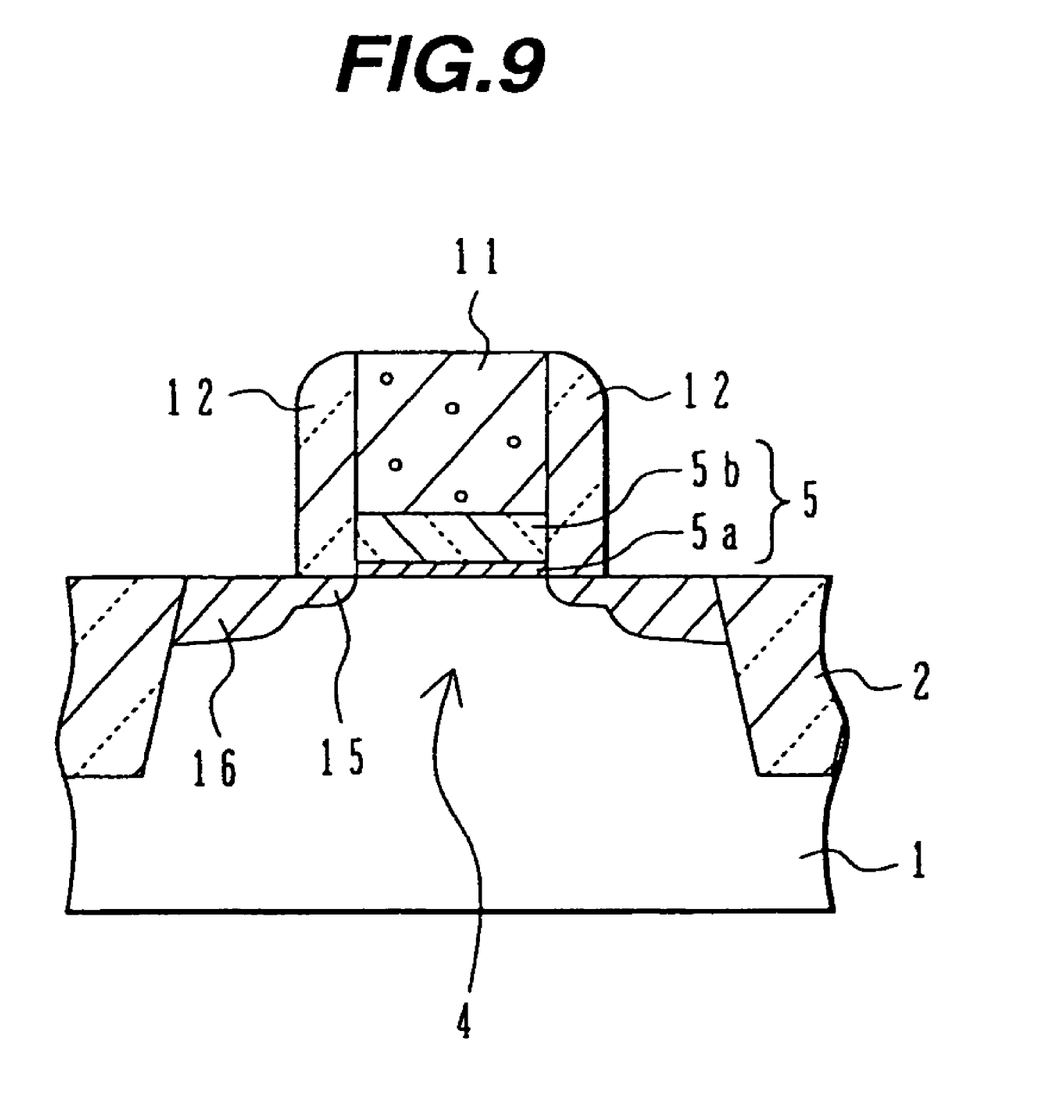
FIG. 9 is a cross sectional view of a semiconductor device according to another embodiment.

With reference to FIG. 9, description will be given on a method of manufacturing a semiconductor device according to another embodiment. A gate insulating film 5 of MISFET shown in FIG. 9 has a two-layer structure of a silicon oxynitride film 5a and a high dielectric constant film 5b. The other structures are similar to those of MISFET shown in FIG. 8D. The high dielectric constant film 5b is made of $HfO_2$, $ZrO_2$, silicate or aluminate thereof, or $Al_2O_3$. The gate insulating film 5 is formed by nitriding the surface of a silicon substrate 1 or by forming a silicon oxynitride film, and depositing the high dielectric constant film 5b through chemical vapor deposition (CVD) or the like.

The silicon oxynitride film 5a prevents the high dielectric constant film 5b and silicon substrate 1 from reacting together to form a silicon oxide film. By preventing the formation of a silicon oxide film, the dielectric constant of the gate insulating film 5 can be avoided from being substantially lowered.

Also in this embodiment, the process conditions are adjusted so that the existence ratio of the $NSi_3$ structure (bonds of Si are all coupled to N) to the total number of nitrogen atoms in the silicon oxynitride film 5a becomes 20% or smaller to improve the electrical characteristics of MISFET.

The present invention has been described in connection with the preferred embodiments. The invention is not limited only to the above embodiments. It is apparent that various modifications, improvements, combinations, and the like can be made by those skilled in the art.

What we claim are:

1. A method of evaluating the characteristics of a semiconductor device, comprising steps of:
    forming a silicon oxynitride film on a surface of a semiconductor substrate;
    measuring an existence ratio of subject nitrogen atoms to a total number of nitrogen atoms in the silicon oxynitride film, wherein three bonds of each subject nitrogen atom are all coupled to silicon atoms and remaining three bonds of each of three silicon atoms connected to the subject nitrogen atom are all coupled to other nitrogen atoms; and
    evaluating characteristics of a MISFET using the silicon oxynitride film as a gate insulating film, in accordance with the measured existence ratio.

2. A method of evaluating the characteristics of a semiconductor device, comprising steps of:
    forming a silicon oxynitride film on a surface of a semiconductor substrate;
    measuring an energy spectrum of electrons on 1 s orbital of nitrogen atoms in the silicon oxynitride film by using X-ray photoelectron spectroscopy;
    separating a peak obtained by X-ray photoelectron spectroscopy into at least two first peaks on a higher energy side than an energy of electrons on 1 s orbital of nitrogen atoms in silicon nitride and one second peak on a lower energy side than at least two first peaks;
    calculating a ratio of an area of the second peak to a total area of at least two first peaks and the second peak; and
    evaluating characteristics of a MISFET using the silicon oxynitride film as a gate insulating film, in accordance with the calculated ratio.

3. A process condition evaluating method comprising steps of:
    forming a silicon oxynitride film on a surface of a semiconductor substrate;
    measuring an existence ratio of subject nitrogen atoms to a total number of nitrogen atoms in the silicon oxynitride film, wherein three bonds of each subject nitrogen atom are all coupled to silicon atoms and remaining three bonds of each of three silicon atoms connected to the subject nitrogen atom are all coupled to other nitrogen atoms; and
    judging adequacy of a process condition of the step of forming the silicon oxynitride film in accordance with the measured existence ratio.

4. A process condition evaluating method comprising steps of:
    forming a silicon oxynitride film on a surface of a semiconductor substrate;
    measuring an energy spectrum of electrons on 1s orbital of nitrogen atoms in the silicon oxynitride film by using X-ray photoelectron spectroscopy;
    separating a peak obtained by X-ray photoelectron spectroscopy into at least two first peaks on a higher energy side than an energy of electrons on 1 s orbital of nitrogen atoms in silicon nitride and one second peak on a lower energy side than at least two first peaks;
    calculating a ratio of an area of the second peak to a total area of at least two first peaks and the second peak; and
    judging adequacy of the step of forming the silicon oxynitride film in accordance with the calculated ratio.

* * * * *